United States Patent
Kawai

(10) Patent No.: US 10,070,517 B2
(45) Date of Patent: Sep. 4, 2018

(54) THREE-DIMENSIONAL CIRCUIT STRUCTURE

(71) Applicant: OMRON CORPORATION, Kyoto-shi, Kyoto (JP)

(72) Inventor: Wakahiro Kawai, Konan (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/554,274

(22) PCT Filed: Feb. 9, 2016

(86) PCT No.: PCT/JP2016/053761
§ 371 (c)(1),
(2) Date: Aug. 29, 2017

(87) PCT Pub. No.: WO2016/140023
PCT Pub. Date: Sep. 9, 2016

(65) Prior Publication Data
US 2018/0084639 A1    Mar. 22, 2018

(30) Foreign Application Priority Data

Mar. 3, 2015  (JP) .................................. 2015-041719

(51) Int. Cl.
*H05K 1/18*    (2006.01)
*H05K 1/02*    (2006.01)

(52) U.S. Cl.
CPC ........... *H05K 1/0284* (2013.01); *H05K 1/185* (2013.01); *H05K 2201/09218* (2013.01)

(58) Field of Classification Search
CPC ...... H05K 1/182; H05K 1/0284; H05K 1/185; H05K 1/183
See application file for complete search history.

(56) References Cited

U.S. PATENT DOCUMENTS 4,845,452 A * 7/1989 Sasaki ................ H03H 1/00
                                                              333/185
5,055,637 A * 10/1991 Hagner ............... H05K 1/111
                                                              174/260

(Continued)

FOREIGN PATENT DOCUMENTS

JP    H4-271188 A    9/1992
JP    H7-086493 A    3/1995

(Continued)

OTHER PUBLICATIONS

Sep. 28, 1992, Chip Component Mounting Structure, Shin et al. JP404271188 English Translation.*

(Continued)

*Primary Examiner* — Steven T Sawyer
(74) *Attorney, Agent, or Firm* — Metrolexis Law Group, PLLC

(57) ABSTRACT

An electronic component (11) is embedded in an end portion of a surface (P1) and an end portion of a surface (P2) adjacent to each other in a three-dimensional base (2). The portion of an electrode (21) exposed from the surface (P1) and an electrode (101) of a packaged IC (41) are connected to each other via a wiring line (201). The portion of the electrode (21) exposed from the surface (P2) and an electrode (25) of an electronic component (15) are connected to each other via a wiring line (202). Accordingly, it is possible to realize a three-dimensional circuit structure requiring no wiring line spanning over or along an end portion thereof.

1 Claim, 2 Drawing Sheets

(56) References Cited

U.S. PATENT DOCUMENTS

| | | | |
|---|---|---|---|
| 2005/0168961 A1* | 8/2005 | Ono | H01L 23/5385 |
| | | | 361/784 |
| 2006/0001138 A1 | 1/2006 | Sakama et al. | |
| 2010/0183169 A1* | 7/2010 | Kobayashi | H01R 13/514 |
| | | | 381/104 |
| 2011/0100707 A1* | 5/2011 | Lee | H01L 33/62 |
| | | | 174/549 |
| 2014/0085850 A1* | 3/2014 | Li | H05K 1/0231 |
| | | | 361/773 |
| 2016/0113139 A1* | 4/2016 | Karpman | H05K 3/284 |
| | | | 361/730 |

FOREIGN PATENT DOCUMENTS

| | | |
|---|---|---|
| JP | H8-191186 A | 7/1996 |
| JP | 2001-102746 A | 4/2001 |
| JP | 2006-018421 A | 1/2006 |
| JP | 2006-024724 A | 1/2006 |
| JP | 2010-087155 A | 4/2010 |
| JP | 2010-141049 A | 6/2010 |

OTHER PUBLICATIONS

The (translated) International Search Report of PCT/JP2016/053761 dated May 10, 2016.

\* cited by examiner

THREE-DIMENSIONAL CIRCUIT STRUCTURE

TECHNICAL FIELD

The present invention relates to a three-dimensional circuit structure having a three-dimensional base in which electronic components are embedded.

RELATED ART

Recently, there is an increasing demand for realizing thin, light, and small wearable products of portable electronic devices, small sensors, health-care devices (electronic thermometers, sphygmomanometers, etc.), and the like. Accordingly, there is an increasing demand for three-dimensional circuit structures in which electronic components are three-dimensionally arranged so as to be mounted at high density.

As one technique for realizing such a three-dimensional circuit structure, Patent Document 1 discloses a circuit device in which insulation boards and dummy boards are stacked one above another to form a three-dimensional insulation base composed of three-dimensional wiring boards, and components are located on the top face and the side faces of such an insulation base, thereby shortening the wiring length.

However, the technique of Patent Document 1 is problematic in that there is limitation on the three-dimensional shape of the circuit device because a plurality of printed wiring boards have to be stacked in a multi-layer form. Thus, conventionally, techniques are proposed that realize a three-dimensional circuit structure without using printed wiring boards.

For example, Patent Document 2 discloses a method for producing a multi-layer three-dimensional circuit board in which a circuit on the surface of a primary injection-molded part is electrically connected to a circuit on the surface of a secondary injection-molded part by forming the secondary injection-molded part on the surface of the primary injection-molded part including a projecting part covered with a copper-plated film such that a front end of the projecting part is exposed from the secondary injection-molded part, and forming a copper-plated film on the surface of the secondary injection-molded part so as to be in contact with the copper-plated film covering the projecting part.

Furthermore, Patent Document 3 discloses a method for producing a three-dimensional wiring structure, including at least four steps of: a base pattern forming step for forming a base pattern of a wiring pattern on a flat sheet type mold; a mold deforming step for deforming the mold into a three-dimensional configuration; a molding step for filling the internal space of the mold with a molding material, and solidifying the molding material to separate the molding material from the mold; and a wiring pattern forming step for forming a wiring pattern on the molding.

However, the technique of Patent Document 2 is problematic in that a wiring line formed at an end portion of the multi-layer three-dimensional circuit board easily breaks. The same can be applied to the technique of Patent Document 3.

In order to address this problem, Patent Document 4 discloses a three-dimensional interconnection structure including a base material made of a resin, a plurality of surface layer interconnections arranged on a surface of the base material, and an inner interconnection arranged within the base material, wherein two surface layer interconnections which are arranged adjacent to each other, separated from the corners of the base material are connected to each other via the inner interconnection.

RELATED ART DOCUMENTS

Patent Documents

Patent Document 1: JP 2001-102746A (published on Apr. 13, 2001)
Patent Document 2: JP 2010-087155A (published on Apr. 15, 2002)
Patent Document 3: JP 2006-24724A (published on Jan. 26, 2006)
Patent Document 4: JP 2010-141049A (published on Jun. 24, 2010)

SUMMARY OF THE INVENTION

Problem to be Solved by the Invention

However, the technique of Patent Document 4 is problematic in that the risk that an inner interconnection breaks cannot be eliminated because the inner interconnection has to be arranged along corners of the base material.

The present invention was arrived at in order to solve the foregoing problems, and it is an object thereof to provide a three-dimensional circuit structure requiring no wiring line spanning over or along an end portion thereof.

Means for Solving the Problems

In order to solve the above-described problems, an aspect of the present invention is directed to a three-dimensional circuit structure including: a three-dimensional base at least having a first surface and a second surface connected to the first surface in non-parallel; and an electronic component at least having a first electrode exposed from the first surface and a second electrode exposed from the second surface, and embedded in an end portion of the first surface and an end portion of the second surface adjacent to each other in the three-dimensional base.

Effects of the Invention

According to an aspect of the present invention, the effect is achieved that it is possible to realize a three-dimensional circuit structure requiring no wiring line spanning over or along an end portion thereof.

EMBODIMENTS OF THE INVENTION

Embodiment 1

Figure 1:
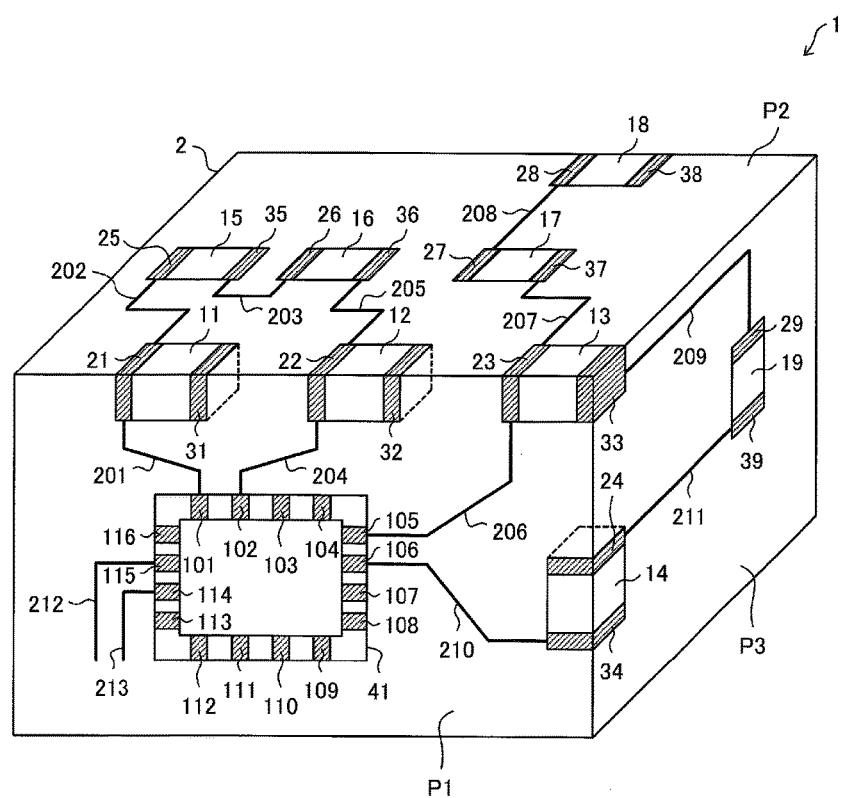
FIG. 1 is a diagram showing the main configuration of a three-dimensional circuit structure according to Embodiment 1 of the present invention.

Hereinafter, Embodiment 1 of the present invention will be described with reference to FIG. 1.
Configuration of Three-Dimensional Circuit Structure 1
FIG. 1 is a diagram showing the main configuration of a three-dimensional circuit structure 1 according to Embodiment 1 of the present invention. As shown in this diagram, the three-dimensional circuit structure 1 includes a three-dimensional base 2, electronic components 11 to 19, a packaged IC 41 (electronic component, packaged integrated circuit), and wiring lines 201 to 213. The electronic components 11 to 19 and the packaged IC 41 are circuit elements constituting one electronic circuit formed in the three-dimensional circuit structure 1.

The three-dimensional circuit structure 1 is a portion that is to be installed on various devices such as portable electronic devices, small sensors, health-care devices (electronic thermometers, sphygmomanometers, etc.), and the like, and that plays the main or sub functions of the devices. The three-dimensional circuit structure 1 can allow the electronic components 11 to 19 and the packaged IC 41 to be three-dimensionally arranged therein, and thus the size thereof can be smaller than that of a conventional circuit structure using printed wiring boards playing the same functions. Accordingly, the three-dimensional circuit structure 1 contributes to realizing thin, light, and small wearable products of various devices on which the three-dimensional circuit structure 1 is installed.

Three-Dimensional Base 2

The three-dimensional base 2 is a cubic base made of a resin material such as ABS resin (acrylonitrile-butadiene-styrene resin), and the electronic components 11 to 19 and the packaged IC 41 are arranged so as to be embedded in the surface of the three-dimensional base 2. As shown in FIG. 1, the three-dimensional base 2 has three surfaces P1 to P3 that are orthogonal to one another. The surface P1 and the surface P2 are connected to each other via one side shared thereby. The surface P1 and the surface P3 are connected to each other via one side shared thereby. The surface P2 and the surface P3 are connected to each other via one side shared thereby.

The shape of the three-dimensional base 2 is not limited to a cubic shape. The three-dimensional base 2 may be a three-dimensional base with any shape at least having two surfaces connected to each other in non-parallel via one end portion shared thereby, in each of which electronic components are embedded. The angle formed by the two surfaces may be 90° or less, or may be larger than 90°.

For easy formation of the three-dimensional base 2, the material for the three-dimensional base 2 is preferably a resin. However, the material for the three-dimensional base 2 is not limited to a resin. The material for the three-dimensional base 2 may be any material that can be used in a method for solidifying a flowable or powder material into a three-dimensional base 2 with a desired shape, such as injection-molding or casting. Examples thereof include organic materials (natural rubbers, synthetic rubbers, etc.) and inorganic materials (ceramics, aluminum, etc.). Specifically, as described later, if the material for the three-dimensional base 2 is a resin, the three-dimensional base 2 can be formed through injection-molding. Meanwhile, if the material for the three-dimensional base 2 is aluminum, the three-dimensional base 2 can be formed through die casting.

In order to prevent an unintended short-circuit between electrodes of electronic components, the material for the three-dimensional base 2 is preferably an insulating material, but may be a conductive material. If the material for the three-dimensional base 2 is a conductive material, this material preferably allows the portion of the three-dimensional base 2 in which electronic components and the like are embedded (the portion from the surface up to a constant depth) to be transformed into an insulating material through any chemical or physical method in any step in production of the three-dimensional circuit structure 1. For example, if the material for the three-dimensional base 2 is aluminum, an aluminum oxide film with a depth at least larger than that of the electrodes of the electronic components may be formed on the surface of the three-dimensional base 2.

Electronic Components 11 to 19

Each of the electronic components 11 to 19 is a passive component including two electrodes (one electrode and the other electrode) such as a chip resistor or a chip capacitor. Each of the electronic components 11 to 19 includes any one of electrodes 21 to 29 (first electrodes) and any one of electrodes 31 to 39 (second electrodes) corresponding thereto.

The electronic components 11 to 13 are embedded in the end portion of the surface P1 and the end portion of the surface P2 adjacent to each other in the three-dimensional base 2. The electronic component 13 is further embedded in the end portion of the surface P3 adjacent to each of the end portion of the surface P1 and the end portion of the surface P2 in the three-dimensional circuit structure 1. The electronic component 14 is embedded in the end portion of the surface P1 and the end portion of the surface P3 adjacent to each other in the three-dimensional base 2. The electronic components 15 to 17 are embedded in the surface P2 of the three-dimensional base 2. They are arranged in the surface P2 at positions spaced apart by a certain distance from the end portions of the surface P2. That is to say, the electronic components 15 to 17 are not embedded in the end portions of the surface P2. The electronic component 18 is embedded in the surface P2, at an end portion thereof opposite to that on the surface P1 side. The electronic component 19 is embedded in the surface P3 of the three-dimensional base 2. The electronic component 19 is arranged at a position spaced apart by a certain distance from the end portions of the surface P3. That is to say, the electronic component 19 is not embedded in the end portions of the three-dimensional circuit structure 1.

Packaged IC 41

The packaged IC 41 is an active component having 16 electrodes 101 to 116, configured by a semiconductor or the like. In a broader sense, the packaged IC 41 is a type of electronic component. The packaged IC 41 is embedded in the surface P1 of the three-dimensional base 2 such that its upper face portion is exposed. The electrodes 101 to 116 are continuously formed on an upper face and side faces of the packaged IC 41. In FIG. 1, upper face portions of the electrodes 101 to 116 are exposed from the surface P1. The packaged IC 41 is embedded in the surface P1 of the three-dimensional base 2. The packaged IC 41 is arranged at a position spaced apart by a certain distance from the end portions of the surface P1. That is to say, the packaged IC 41 is not arranged at the end portions of the three-dimensional base 2.

Wiring Lines 201 to 213

The wiring lines 201 to 213 are made of a conductive material such as silver nanoink. The wiring lines 201 to 213 are formed on any of the surfaces P1 to P3 of the three-dimensional base 2. Specifically, as described later, each of the wiring lines 201 to 213 does not span over an end portion of the surfaces P1 to P3. That is to say, each of the wiring lines 201 to 213 is formed only within a surface where that wiring line is formed, and does not extend to another surface.

Connection of Electronic Components

The wiring line 201 has one end thereof connected to the electrode 101 of the packaged IC 41 and the other end connected to the portion of the electrode 21 of the electronic component 11 exposed from the surface P1. The wiring line 202 has one end thereof connected to the portion of the electrode 21 of the electronic component 11 exposed from the surface P2 and the other end connected to the electrode 25 of the electronic component 15. The wiring line 201 is formed only within the surface P1, and the wiring line 202 is formed only within the surface P2. The packaged IC 41 and the electronic component 15 are connected to each other via the wiring line 201, the electronic component 11 embedded in the end portions of the three-dimensional base 2, and the wiring line 202. In the three-dimensional circuit structure 1, there is no wiring line spanning over an end portion of the three-dimensional base 2, for connecting the packaged IC 41 and the electronic component 15.

The wiring line 203 has one end thereof connected to the electrode 35 of the electronic component 15 and the other end connected to the electrode 26 of the electronic component 16. In this manner, the electronic component 15 and the electronic component 16 are connected in series.

The wiring line 204 has one end thereof connected to the electrode 102 of the packaged IC 41 and the other end connected to the portion of the electrode 22 of the electronic component 12 exposed from the surface P1. The wiring line 205 has one end thereof connected to the portion of the electrode 22 of the electronic component 12 exposed from the surface P2 and the other end connected to the electrode 36 of the electronic component 16. The wiring line 204 is formed only within the surface P1, and the wiring line 205 is formed only within the surface P2. The wiring lines 204 and 205 are connected to the same electrode 22 continuously formed at the end portion of the surface P1 and the end portion of the surface P2, and thus the packaged IC 41 and the electronic component 16 are connected to each other via the wiring line 204, the electrode 22, and the wiring line 205. In this manner, the electrode 22 has the function of a relay point for directly connecting the packaged IC 41 embedded in the surface P1 and the electronic component 16 embedded in the surface P2, without interposing another electronic component therebetween. Furthermore, in the three-dimensional circuit structure 1, there is no wiring line spanning over an end portion of the three-dimensional base 2, for connecting the packaged IC 41 and the electronic component 16.

The wiring line 206 has one end thereof connected to the electrode 105 of the packaged IC 41 and the other end connected to the portion of the electrode 23 of the electronic component 13 exposed from the surface P1. The wiring line 207 has one end thereof connected to the portion of the electrode 23 of the electronic component 13 exposed from the surface P1 and the other end connected to the electrode 37 of the electronic component 17. The wiring line 206 is formed only within the surface P1, and the wiring line 207 is formed only within the surface P2. The wiring lines 206 and 207 are connected to the same electrode 23 continuously formed at the end portion of the surface P1 and the end portion of the surface P2, and thus the packaged IC 41 and the electronic component 17 are connected to each other via the wiring line 206, the electrode 23, and the wiring line 207. In this manner, the electrode 23 has the function of a relay point for directly connecting the packaged IC 41 and the electronic component 17, without interposing another electronic component therebetween. Furthermore, in the three-dimensional circuit structure 1, there is no wiring line spanning over an end portion of the three-dimensional base 2, for connecting the packaged IC 41 and the electronic component 17.

The wiring line 208 has one end thereof connected to the electrode 27 of the electronic component 17 and the other end connected to the electrode 28 of the electronic component 18. In this manner, the electronic component 17 and the electronic component 18 are connected in parallel.

The wiring line 209 has one end thereof connected to the portion of the electrode 33 of the electronic component 13 exposed from the surface P3 and the other end connected to the electrode 29 of the electronic component 19. Accordingly, the packaged IC 41 embedded in the surface P1 and the electronic component 19 embedded in the surface P3 are connected to each other via the wiring line 206, the electronic component 13, and the wiring line 209. Moreover, the electronic component 17 embedded in the surface P2 and the electronic component 19 embedded in the surface P3 are connected to each other via the wiring line 207, the electronic component 13, and the wiring line 209. In this manner, the wiring line 206 is formed only within the surface P1, and the wiring line 209 is formed only within the surface P3. The packaged IC 41 and the electronic component 19 are connected to each other via the wiring line 206, the electronic component 13 embedded in the end portions of the three-dimensional base 2, and the wiring line 209. In the three-dimensional circuit structure 1, there is no wiring line spanning over an end portion of the three-dimensional base 2, for connecting the packaged IC 41 and the electronic component 19.

The wiring line 210 has one end thereof connected to the electrode 106 of the packaged IC 41 and the other end connected to the portion of the electrode 34 of the electronic component 14 exposed from the surface P1. The wiring line 211 has one end thereof connected to the portion of the electrode 24 of the electronic component 14 exposed from the surface P3 and the other end connected to the electrode 39 of the electronic component 19. The wiring line 210 is formed only within the surface P1, and the wiring line 211 is formed only within the surface P3. The packaged IC 41 and the electronic component 19 are connected to each other via the wiring line 210, the electronic component 14 embedded in the end portions of the three-dimensional base 2, and the wiring line 211. In the three-dimensional circuit structure 1, there is no wiring line spanning over or along an end portion of the three-dimensional base 2, for connecting the packaged IC 41 and the electronic component 19.

The wiring line 212 has one end thereof connected to the electrode 115 of the packaged IC 41 and the other end connected to an electrode of another electronic component or another terminal (not shown). The wiring line 213 has one end thereof connected to the electrode 114 of the packaged IC 41 and the other end connected to an electrode of another electronic component or another terminal (not shown).

As described above, according to this embodiment, a three-dimensional circuit structure 1 requiring no wiring line spanning over or along an end portion of the three-dimensional base 2 is provided.

Method for Producing Three-Dimensional Circuit Structure 1

Hereinafter, an example of the method for producing the three-dimensional circuit structure 1 will be described. This method has four steps.

Temporary Fixing Step

First, three sheets for temporary fixing the electronic components 11 to 19 and the packaged IC 41 are prepared. The first to third sheets respectively correspond to the surfaces P1 to P3. The material for the first to third base material sheets is preferably an ultraviolet light-transmitting and flexible material, and examples thereof include PET (polyethylene terephthalate), PEN (polyethylenenaphthalate), PPS (polyphenylene sulfide), and the like.

The packaged IC 41 that is to be embedded in the surface P1 of the three-dimensional circuit structure 1 is temporarily fixed to the first base material sheet. Specifically, the packaged IC 41 is temporarily fixed to a position corresponding to a position spaced apart by a certain distance from the end portions of the surface P1, in the first base material sheet.

The electronic components 11 to 18 that are to be embedded in the surface P2 of the three-dimensional circuit structure 1 are temporarily fixed to the second base material sheet. Specifically, the electronic components 11 to 13 are temporarily fixed to positions corresponding to a first end portion (end portion on the surface P1 side) of the surface P2, in the second base material sheet. The electronic components 15 to 17 are temporarily fixed to positions corresponding to positions spaced apart by a certain distance from the end portions of the surface P2, in the three-dimensional circuit structure 1. The electronic component 18 is temporarily fixed to a position corresponding to a second end portion (end portion on the side opposite to the first end portion) of the surface P2, in the second base material sheet.

The electronic components 14 and 19 that are to be embedded in the surface P3 of the three-dimensional circuit structure 1 are temporarily fixed to the third base material sheet. At that time, the electronic component 14 is temporarily fixed to a position corresponding to a first end portion (end portion on the surface P1 side) of the surface P3, in the third base material sheet. Furthermore, the electronic component 19 is temporarily fixed to a position corresponding to a position spaced apart by a certain distance from the end portions of the surface P3, in the third base material sheet.

An adhesive is applied to the surfaces of the base material sheets to which the electronic components and the like are to be temporarily fixed, and, in a state where the positional relationship of the electronic components is determined, the electronic components are temporarily fixed to the corresponding temporary fixing surfaces of the base material sheets. As the adhesive, those with a short curing time are preferable, and, for example, an ultraviolet light-curing adhesive may be used. An ultraviolet light-curing adhesive is cured when being irradiated with ultraviolet light, and thus base material sheets and electronic components adhere to each other. Accordingly, if the base material sheets are irradiated with ultraviolet light from the surface to which the adhesive has been applied, the electronic components themselves become an obstacle that blocks ultraviolet light irradiation on the adhesive, which may make the curing (adhesion) insufficient. Thus, if an ultraviolet light-transmitting material is used for the base material sheets, and the base material sheets are irradiated with ultraviolet light from the surface to which the adhesive has not been applied, the adhesive can be sufficiently cured, and the electronic components can be reliably fixed to the base material sheets in a short time.

Specifically, as an ultraviolet light-curing adhesive, GL-300511 (manufactured by Gluelabo Ltd.) is used and applied to a thickness of 2 to 3 µm to first to third base material sheets made of PET having a thickness of 50 µm. Subsequently, the positions of the electronic components are determined, and the first to third base material sheets are irradiated with ultraviolet light at 3000 mJ/cm² from the surface to which the adhesive has not been applied, so that the adhesive is cured, and the electronic components are fixed.

Injecting Step

After the electronic component 11 and the like are temporarily fixed to the first to third base material sheets, the first to third base material sheets are arranged in a mold for producing the three-dimensional circuit structure 1. This mold is a mold for injection-molding of the three-dimensional base 2 in which the electronic component 11 and the like are embedded. The first to third base material sheets are arranged such that the surface on the side opposite to the surface of the first to third base material sheets to which the electronic component 11 and the like have been temporarily fixed is in contact with the corresponding surface of the mold. The first to third base material sheets are respectively arranged at the positions for forming the surfaces P1 to P3 of the three-dimensional base 2 in the mold. In this state, a resin material such as ABS resin is injected at a molding temperature of 80° C., an injected resin temperature of 180° C., and an injection pressure of 20 kg/cm². Accordingly, the electronic component 11, the packaged IC 41, and the like are embedded in the three-dimensional base 2.

The resin material preferably contains thermally conductive fillers in advance. Accordingly, heat generated from the electronic component 11 and the like during the injection-molding can be easily released to the outside. Examples of the thermally conductive fillers include powders of metals such as copper, powders of inorganic materials such as aluminum nitride and aluminum oxide, and the like.

Electrode Exposing Step

The first to third base material sheets are removed from the molded part obtained by the injection-molding, and thus the electrode 21 and the electrode 31 of the electronic component 11, the electrode 101 of the packaged IC 41, and the like are exposed from the surfaces P1 to P3 of the three-dimensional base 2.

Wiring Line Forming Step

Lastly, the wiring lines 201 to 211 for connecting the electrodes such as the electrode 21, the electrode 31, and the electrode 101 exposed from the surfaces P1 to P3 of the three-dimensional base 2 are formed on the surfaces P1 to P3. At that time, for example, a method for injecting conductive silver nanoink that is the material for the wiring line 201 and the like (e.g., inkjet printing) is used. Alternatively, screen printing or copper plating also may be used. After the wiring lines are completely formed, the three-dimensional circuit structure 1 is completed in which the electronic components 11 to 19 and the packaged IC 41 are embedded.

As shown in FIG. 1, in the three-dimensional circuit structure 1, the electronic components embedded in different surfaces of the three-dimensional base 2 can be connected to each other via the electrodes of the electronic components embedded in the end portions of the three-dimensional base 2. That is to say, wiring lines for connecting the electronic components embedded in different surfaces of the three-dimensional base 2 do not have to be formed spanning over the end portions of the surfaces P1 to P3. Accordingly, there is no need for a printing head with a shape that matches the end portions, contrary to the cases where wiring lines are printed on the end portions by using methods such as inkjet printing. Furthermore, there is no need for rotational movement of the three-dimensional base 2 in a complex manner during the printing. Accordingly, it is possible to eliminate the need for introduction of an expensive printing apparatus for producing the three-dimensional circuit structure 1, and to prevent an increase in the production cost of the three-dimensional circuit structure 1. Furthermore, wiring lines do not have to be formed at all at the end portions of the three-dimensional base 2, and thus the total wiring length of the electronic circuit can be made shorter than that of an electronic circuit in which wiring lines are formed at the end portions thereof.

The surfaces of the three-dimensional base 2 in which the electronic components are embedded are not limited to the surfaces P1 to P3. Electronic components may be embedded also in the other three surfaces not shown in FIG. 1. In other words, it is sufficient that electronic components are embedded on any one of the six surfaces of the three-dimensional base 2, and at least one other surface adjacent to that one surface.

Embodiment 2

Hereinafter, Embodiment 2 of the present invention will be described with reference to FIG. 2. The same constituent elements as those in the foregoing embodiment are denoted by the same reference numerals, and a detailed description thereof has been omitted.

Configuration of Three-Dimensional Circuit Structure 1a

Figure 2:
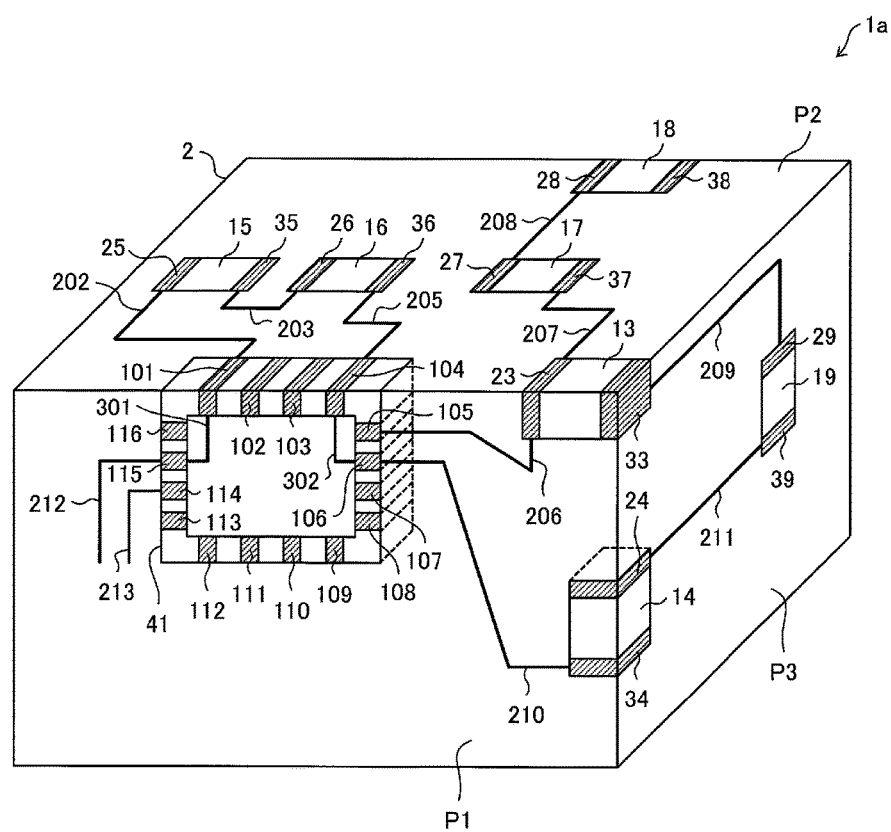
FIG. 2 is a diagram showing the main configuration of a three-dimensional circuit structure according to Embodiment 2 of the present invention.

FIG. 2 is a diagram showing the main configuration of a three-dimensional circuit structure 1a according to Embodiment 2 of the present invention. As shown in this diagram, the three-dimensional circuit structure 1a includes the three-dimensional base 2, the electronic components 13 to 19, the packaged integrated circuit 41 (electronic component), and the wiring lines 203 to 213. The electronic components 13 to 19 and the packaged IC 41 are circuit elements constituting one electronic circuit formed in the three-dimensional circuit structure 1a.

In this embodiment, the packaged IC 41 is embedded in the end portion of the surface P1 and the end portion of the surface P2 adjacent to each other in the three-dimensional base 2. At that time, the packaged IC 41 is positioned such that the electrodes 101 to 104 are exposed from both of the surface P1 and the surface P2. The packaged IC 41 has two internal wiring lines 301 and 302, in addition to the electrodes 101 to 116.

The wiring line 202 has one end thereof connected to the portion of the electrode 101 of the packaged IC 41 exposed from the surface P2 and the other end connected to the electrode 25 of the electronic component 15. The portion of the electrode 101 exposed from the surface P1 is connected, inside the packaged IC 41, to one end of the internal wiring line 301. The other end of the internal wiring line 301 is connected, inside the packaged IC 41, to the electrode 115. The electrode 115 is connected to one end of the wiring line 212, and the other end of the wiring line 212 is connected to an electrode of another electronic component (not shown).

The wiring line 205 has one end thereof connected to the portion of the electrode 104 of the packaged IC 41 exposed from the surface P2 (first electrode) and the other end connected to the electrode 26 of the electronic component 16. The portion of the electrode 104 exposed from the surface P1 (second electrode) is connected, inside the packaged IC 41, to one end of the internal wiring line 302. The other end of the internal wiring line 302 is connected, inside the packaged IC 41, to the electrode 106 (third electrode). The electrode 106 is connected to one end of the wiring line 210, and the other end of the wiring line 210 is connected to the portion of the electrode 34 of the electronic component 14 exposed from the surface P1.

As described above, in the packaged IC 41, the electrode 104 and the electrode 106 are connected to each other via the internal wiring line 302. Accordingly, the electronic component 14 embedded in the surface P3 and the electronic component 16 embedded in the surface P2 are directly connected to each other without using a functional region inside the packaged IC 41. In this manner, according to this embodiment, the packaged IC 41 is embedded in the end portions of the three-dimensional base 2, and thus two electronic component embedded in different surfaces can be directly connected to each other via two electrodes contained in the packaged IC 41. Accordingly, contrary to the three-dimensional circuit structure 1 in Embodiment 1, the electronic component 12 does not have to be embedded in the end portions of the three-dimensional base 2, and thus the configuration of the three-dimensional circuit structure 1a can be simplified.

Furthermore, since the packaged IC 41 has a large number of electrodes, even with the three-dimensional circuit structure 1a in which only the packaged IC 41 is embedded in the end portions of the three-dimensional base 2, a large number of electronic components embedded in different surfaces can be connected to each other via the electrodes inside the packaged IC 41.

SUMMARY

In order to solve the above-described problems, an aspect of the present invention is directed to a three-dimensional circuit structure including: a three-dimensional base at least having a first surface and a second surface connected to the first surface in non-parallel; and an electronic component at least having a first electrode exposed from the first surface and a second electrode exposed from the second surface, and embedded in an end portion of the first surface and an end portion of the second surface adjacent to each other in the three-dimensional base.

With this configuration, a first electronic component arranged on the first surface of the three-dimensional base and the first electrode of the electronic component embedded in the end portion of the three-dimensional base can be connected to each other via a first wiring line. Moreover, a second electronic component arranged on the second surface of the three-dimensional base and the second electrode of the electronic component embedded in the end portion of the three-dimensional base can be connected to each other via a second wiring line. With such connection, the first and second electronic components arranged on different surfaces can be connected to each other via the first wiring line, the second wiring line, and the electronic component embedded in the end portions of the three-dimensional base. In order to realize such connection, there is no need for a wiring line spanning over or along an end portion of the three-dimensional base. Accordingly, it is possible to realize a three-dimensional circuit structure requiring no wiring line spanning over or along an end portion of a three-dimensional base.

Furthermore, another aspect of the present invention is directed to the three-dimensional circuit structure, wherein the electronic component is a passive component having one electrode and another electrode.

With this configuration, it is possible to realize a three-dimensional circuit structure in which various passive components such as a chip resistor or a chip capacitor are embedded in the end portions of the three-dimensional base.

Furthermore, another aspect of the present invention is directed to the three-dimensional circuit structure, wherein the one electrode is exposed on the first surface, the other electrode is exposed on the second surface, the portion of the one electrode exposed from the first surface is the first electrode, and the portion of the other electrode exposed from the second surface is the second electrode.

With this configuration, an electronic component arranged on the first surface, the electronic component embedded in the end portions of the three-dimensional base, and an electronic component arranged on the second surface can be connected to one another in series.

Furthermore, another aspect of the present invention is directed to the three-dimensional circuit structure, wherein the one electrode or the other electrode is exposed on the first surface and the second surface, and the portions of the one electrode or the other electrode exposed from the first surface and the second surface are respectively the first electrode and the second electrode.

With this configuration, an electronic component arranged on the first surface and an electronic component arranged on the second surface can be directly connected to each other via an electrode of the electronic component or a terminal embedded in the end portions of the three-dimensional base.

Furthermore, another aspect of the present invention is directed to the three-dimensional circuit structure according to the above-described aspect 1, wherein the electronic component is a packaged integrated circuit having at least three electrodes including the first electrode and the second electrode.

With this configuration, it is possible to realize a three-dimensional circuit structure in which a packaged integrated circuit is embedded in the end portions of the three-dimensional base.

Furthermore, another aspect of the present invention is directed to the three-dimensional circuit structure, wherein the first electrode and the second electrode constitute one continuously formed electrode, and the electronic component further has a third electrode exposed from the second surface, and an internal wiring line connected to the second electrode and the third electrode.

With this configuration, an electronic component arranged on the first surface and an electronic component arranged on the second surface can be directly connected to each other via the first to third electrodes of the packaged integrated circuit embedded in the end portions of the three-dimensional base.

The present invention is not limited to the abovementioned embodiments, and various modifications can be made within the scope described in the claims. Embodiments that are obtained by appropriately combining the technical means disclosed in the different embodiments are included in the technical scope of the present invention. Furthermore, a new technical feature may be formed by combining the technical means disclosed in the embodiments.

INDUSTRIAL APPLICABILITY

The present invention can be preferably used as three-dimensional circuit structures installed on various devices such as portable electronic devices, small sensors, healthcare devices (electronic thermometers, sphygmomanometers, etc.), and the like.

INDEX TO THE REFERENCE NUMERALS 1, 1a Three-dimensional circuit structure
2 Three-dimensional base
11 to 19 Electronic component
21 to 29 Electrode (one electrode)
31 to 39 Electrode (another electrode)
41 Packaged IC
201 to 213 Wiring line
301, 302 Internal wiring line

The invention claimed is:
1. A three-dimensional circuit structure comprising:
a three-dimensional base at least having a first surface and a second surface connected to the first surface in non-parallel;
first electronic component including (i) one electrode at least having a first portion exposed from the first surface and a second portion exposed from the second surface and (ii) an other electrode, the first electronic component being embedded in an end portion of the first surface and an end portion of the second surface adjacent to each other in the three-dimensional base, the first electronic component being a passive component;
a second electronic component embedded in the first surface;
a third electronic component embedded in the second surface;
a first wiring line on the first surface, the first wiring line being connected to the first portion and the second electronic component at the first surface; and
a second wiring line on the second surface, the second wiring line being connected to the second portion and the third electronic component at the second surface.

* * * * *